United States Patent
Yoon et al.

(10) Patent No.: US 9,594,404 B2
(45) Date of Patent: Mar. 14, 2017

(54) BODY-WEARABLE ELECTRONIC DEVICE

(71) Applicant: Samsung Electronics Co., Ltd., Gyeonggi-do (KR)

(72) Inventors: Byoung-Uk Yoon, Gyeonggi-do (KR); Moo-Hyun Baek, Gyeongsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/712,781

(22) Filed: May 14, 2015

(65) Prior Publication Data
US 2016/0128209 A1    May 5, 2016

(30) Foreign Application Priority Data

Nov. 4, 2014  (KR) .......................... 10-2014-0152123

(51) Int. Cl.
*G06F 1/16*     (2006.01)
*G01R 33/07*    (2006.01)

(52) U.S. Cl.
CPC ............. *G06F 1/163* (2013.01); *G01R 33/07* (2013.01)

(58) Field of Classification Search
CPC ................................ G06F 1/163; G01R 33/07
USPC .................................................... 361/679.03
See application file for complete search history.

(56) References Cited

U.S. PATENT DOCUMENTS

| | | | | |
|---|---|---|---|---|
| 5,889,737 A | * | 3/1999 | Alameh | G04C 10/00 368/204 |
| 6,192,253 B1 | * | 2/2001 | Charlier | H04B 1/385 455/340 |
| 7,793,361 B2 | * | 9/2010 | Ishihara | A41D 1/002 2/170 |
| 9,311,686 B2 | * | 4/2016 | Roush | G06Q 50/22 |
| 9,317,076 B2 | * | 4/2016 | Rayner | F16M 13/00 |
| 9,318,907 B2 | * | 4/2016 | Huang | H02J 7/0045 |
| 2004/0233786 A1 | * | 11/2004 | Ting | G04B 47/00 368/2 |
| 2012/0092822 A1 | * | 4/2012 | Mooring | G04G 17/04 361/679.21 |
| 2012/0194976 A1 | * | 8/2012 | Golko | G06F 1/163 361/679.01 |
| 2013/0227988 A1 | * | 9/2013 | Padgett | A44C 5/14 63/1.13 |
| 2015/0186705 A1 | * | 7/2015 | Magi | G06K 9/0002 382/125 |
| 2015/0189134 A1 | * | 7/2015 | Joo | G06F 1/163 348/373 |

* cited by examiner

*Primary Examiner* — Nidhi Thaker

(57) ABSTRACT

A body-wearable electronic device according to one of various embodiments of the present disclosure includes: a wearing member which can be worn on the user's body; and at least one main unit configured to be attached to and detached from the wearing member, and can be variously implemented according to embodiments.

16 Claims, 12 Drawing Sheets

BODY-WEARABLE ELECTRONIC DEVICE

CROSS-REFERENCE TO RELATED APPLICATION(S) AND CLAIM OF PRIORITY

The present application is related to and claims the priority under 35 U.S.C. §119(a) to Korean Application Serial No. 10-2014-0152123, which was filed in the Korean Intellectual Property Office on Nov. 4, 2014, the entire content of which is hereby incorporated by reference.

TECHNICAL FIELD

Various embodiments of the present disclosure relate to an electronic device and, for example, to a body-wearable electronic device.

BACKGROUND

Typically, an electronic device refers to a device which performs a specific function corresponding to an installed program, such as a home appliance, an electronic diary, a portable multimedia player, a mobile communication terminal, a tablet PC, an image/sound unit, a desktop/laptop computer, a navigation unit for a vehicle, and the like. For example, such an electronic device can output stored information in the form of sound or image. With the increase of degree of integration and the popularization of hyper-speed and high capacity wireless communication, recently, a single mobile communication terminal has various functions. For example, an entertainment function such as a game, a multimedia function such as reproduction of a music file and a video file, a communication and security function for mobile banking or the like, a scheduling function, an electronic wallet function, etc. are integrated into a single electronic device, in addition to a communication function.

A portable electronic device, such as an electronic diary, a portable multimedia player, a mobile communication terminal, or a tablet PC, is generally equipped with a flat display device and a battery and has the appearance of a bar type, a folder type, or a sliding type. Recent developments in electronic communication technology has made such electronic device more compact and even commercialized electronic devices that can be worn on a part of the human body, such as the wrist or the head.

SUMMARY

A body-wearable electronic device may be required to be compact and lightweight in order to make the user feel comfortable when wearing the device. Therefore, the function or performance may be limited compared with a conventional electronic device.

To address the above-discussed deficiencies, it is a primary object to provide a body-wearable electronic device that can implement various functions while making the user feel comfortable when wearing the device.

In addition, various embodiments of the present disclosure provide a body-wearable electronic device that can implement various appearances.

In addition, various embodiments of the present disclosure provide a body-wearable electronic device that can complement or expand a limited function.

A body-wearable electronic device according to one of various embodiments of the present disclosure includes: a wearing member that can be worn on the body of a user; and at least one main unit configured to be attached to and detached from the wearing member.

According to another embodiment, an additional device (e.g. fastening member) provided on the wearing member is electrically connected to the main unit to complement or expand the function of the electronic device, for example, to provide an antenna function.

According to still another embodiment, a plurality of main units is mounted on the wearing member to complement/expand functions of each other or to further improve the performance of the electronic device.

As used herein, the "performance" may include the calculation rate, the storage capacity, the battery capacity, the antenna function expansion, expansion of a connection device such as an interface terminal, and the like.

An electronic device according to various embodiments of the present disclosure is advantageous in that, according to the user's preferences or according to characteristics of the body, such as the curvature of the wrist, the wearing member can be easily replaced so that the user can both pursue individuality and feel comfortable when wearing the device. In addition, the wearing member can be easily replaced while securing coupling between the main unit and the wearing member, and the main unit is prevented from escaping from the wearing member even when the user is wearing the device, thereby maintaining a stable wearing state. Furthermore, the function of the electronic device, e.g. the main unit, can be complemented/expanded by arranging a fastening member or by mounting a plurality of main units on the wearing member.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
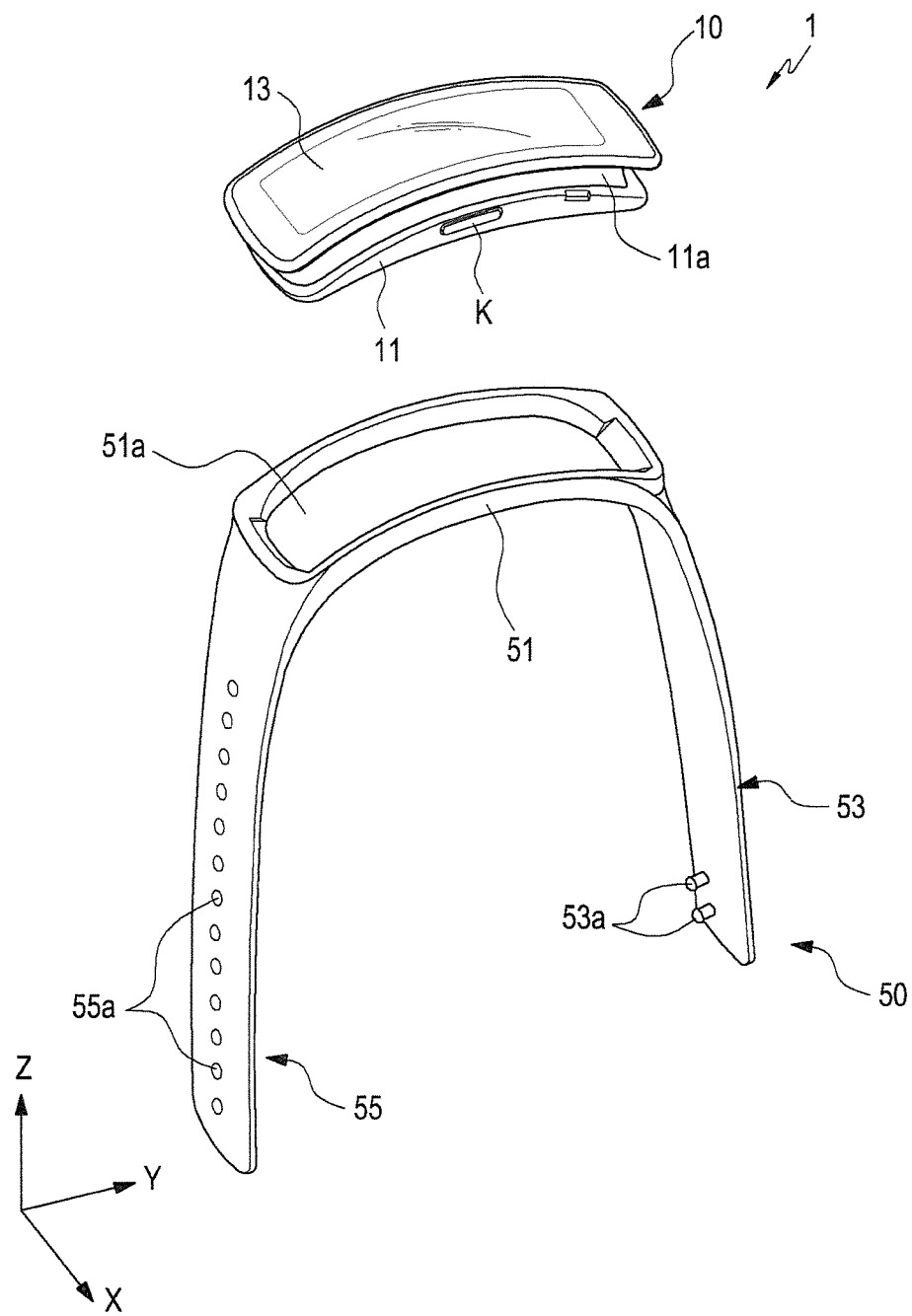
FIG. 1 is a perspective view illustrating a main unit of an electronic device when the main unit is separated from a wearing member according to embodiments of the present disclosure.

FIGS. 1 through 18, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device. The present disclosure may have various modifications and various embodiments, among which specific embodiments will now be described more fully with reference to the accompanying drawings. However, it should be understood that the present disclosure is not limited to the specific embodiments, but the present disclosure includes all modifications, equivalents, and alternatives within the spirit and the scope of the present disclosure.

Although the terms including an ordinal number such as first, second, etc. can be used for describing various elements, the structural elements are not restricted by the terms. The terms are only used to distinguish one element from another element. For example, without departing from the scope of the present disclosure, a first structural element may be named a second structural element. Similarly, the second structural element also may be named the first structural element. As used herein, the term "and/or" includes any and all combinations of one or more associated items.

Further, the relative terms "a front surface", "a rear surface", "a top surface", "a bottom surface", and the like which are described with respect to the orientation in the drawings may be replaced by ordinal numbers such as first and second. In the ordinal numbers such as first and second, their order are determined in the mentioned order or arbitrarily and may not be arbitrarily changed if necessary.

In the present disclosure, the terms are used to describe specific embodiments, and are not intended to limit the present disclosure. As used herein, the singular forms are intended to include the plural forms as well, unless the context clearly indicates otherwise. In the description, it should be understood that the terms "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present specification.

In the present disclosure, an electronic device can be a random device, and the electronic device may be called a terminal, a portable terminal, a mobile terminal, a communication terminal, a portable communication terminal, a portable mobile terminal, a display device or the like.

For example, the electronic device can be a smartphone, a portable phone, a game player, a TV, a display unit, a heads-up display unit for a vehicle, a notebook computer, a laptop computer, a tablet Personal Computer (PC), a Personal Media Player (PMP), a Personal Digital Assistants (PDA), and the like. The electronic device can be implemented as a portable communication terminal which has a wireless communication function and a pocket size. Further, the electronic device can be a flexible device or a flexible display unit.

The electronic device can communicate with an external electronic device, such as a server or the like, or perform an operation through an interworking with the external electronic device. For example, the electronic device can transmit an image photographed by a camera and/or position information detected by a sensor unit to the server through a network. The network can be a mobile or cellular communication network, a Local Area Network (LAN), a Wireless Local Area Network (WLAN), a Wide Area Network (WAN), an Internet, a Small Area Network (SAN) or the like, but is not limited thereto.

Figure 2:
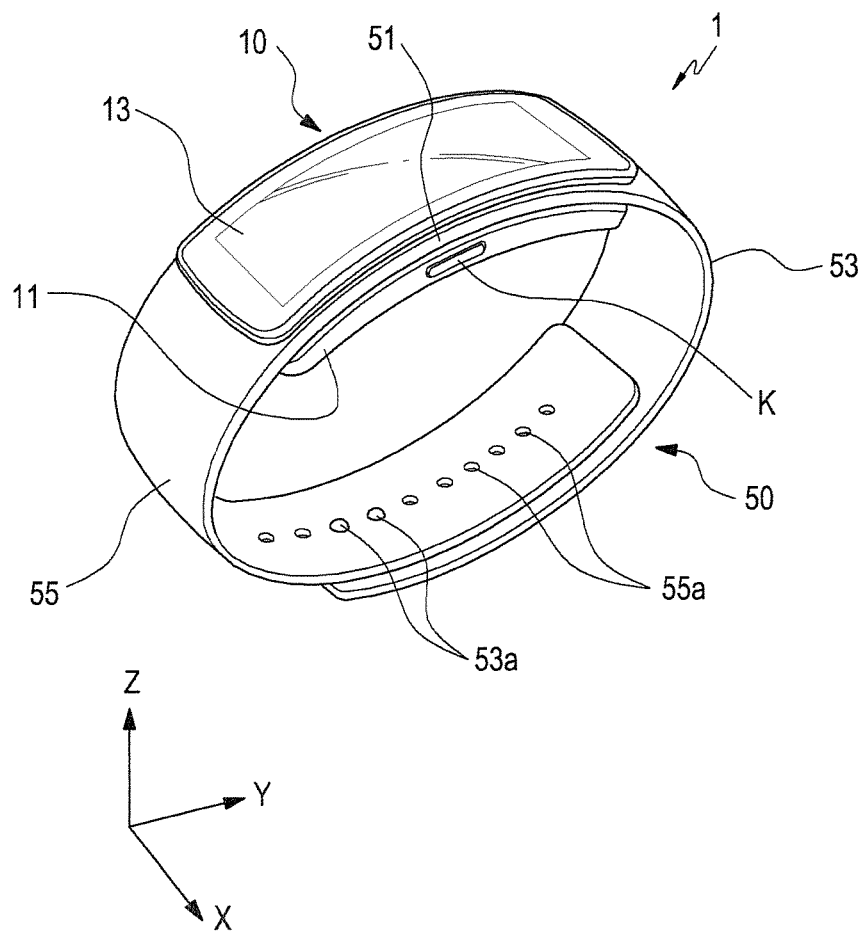
FIG. 2 is a perspective view illustrating the electronic device when the device is worn according to embodiments of the present disclosure.

FIG. 1 is a perspective view illustrating a main unit of an electronic device when the main unit is separated from a wearing member according to embodiments of the present disclosure. FIG. 2 is a perspective view illustrating the electronic device when the device is worn according to embodiments of the present disclosure.

Referring to FIG. 1 and FIG. 2, a three-dimensional X/Y/Z rectangular coordinate system is illustrated, wherein Z-axis refers to the vertical direction (thickness direction) of a main unit 10 of the electronic device 1, X-axis refers to the transverse direction of the main unit 10, and Y-axis refers to the longitudinal direction of the main unit 10.

The present embodiment illustrates, as the electronic device 1, a body-wearable electronic device, for example, an electronic device that can be worn on the wrist like a watch or a bracelet. However, various embodiments of the present disclosure are not limited thereto, and electronic devices according to various embodiments of the present disclosure can be implemented as various communication devices or auxiliary medical devices. In addition, an electronic device according to various embodiments of the present disclosure can be variously applied to a part of the user's body, which has a curvature. Examples of parts of the user's body, which have curvatures, include wrists, forearms, and ankles. In addition, an electronic device according to various embodiments of the present disclosure can be conveniently worn on various parts of the user's body according to the configuration of its wearing member.

An electronic device 1 according to one of various embodiments of the present disclosure includes the main unit 10 (function device unit) and a wearing member 50 that can be worn on the user's body, like a band or a strap. The main unit 10 can be configured to be attached to and detached from the wearing member 50. For example, the main unit 10 can be coupled to the wearing member 50 while being at least partially contained. While the main unit 10 is coupled to the wearing member 50, at least a part of the main unit 10 can face a part of the wearing member 50. On the main unit 10, a display device 13 for displaying various types of information, a pressing key (e.g. side key K) for inputting various types of information, a sensor unit (e.g. bio-signal detection sensor, proximity sensor), a touch input unit, or the like can be arranged.

The main unit 10 can have the shape of a bar, at least a part of which has a curvature corresponding to the user's body. For example, the main unit 10 can have the shape of a rectangle largely extending in the longitudinal direction (Y-axis direction) having a curvature. The main unit 10 can have a binding recess 11a formed on its side surface to engage with the wearing member 50. A plurality of binding recesses 11a can be formed on the side surface of the main unit 10, or the binding recess 11a can extend along the periphery of the main unit 10 in the shape of a closed curved line.

The wearing member 50 enables the main unit 10 to be stably worn on the user's body and, if necessary, can force the main unit 10 against the user's skin. The above-mentioned wearing member 50 can be implemented as a band or a strap, which is made of an elastic material, or a chain structure including pieces made of a non-elastic material and connected to each other. In addition, since the main unit 10 can be attached to and detached from the wearing member 50, the user can replace the wearing member 50 with one conforming to individuality or preferences. According to another embodiment, the portion (e.g. seating portion 51) of the wearing member 50, which is coupled to the main unit 10, can be configured to deform elastically, while portions of wearing surfaces (e.g. inner surfaces of first and second wearing members 53 and 55), which are forced against the user's body, may not be made of an elastic material. The wearing member 50 can include an opening portion 51a extending in one direction, which the main unit 10 is attached to and detached from. The opening portion 51a can have the shape of a through-hole, which fully extends through the inner and outer surfaces of the wearing member 50, or the shape of a recess that is partially indented from the outer surface of the wearing member 50. For example, the main unit 10 can be contained in the opening portion 51a while at least a part faces a part of the opening portion 51a. The seating portion 51 has the shape of a closed curved line and forms the opening portion 51a, and at least the seating portion 51 of the wearing member 50 can be made of an elastic material. When the main unit 10 is coupled to the wearing member 50, at least a part of the seating portion 51 can be fitted into the binding recess 11a, which extends along the side surface of the main unit 10.

The opening portion 51a is an open space, to which the main unit 10 is fitted, for example, which contains at least a part of the main unit 10, and has a shape surrounded by the seating portion 51. The opening portion 51a according to the present embodiment can have an overall shape of a rectangle having a thickness. Seen from above, the opening portion 51a can have the shape of a rectangle having a length in the longitudinal direction (Y) larger than a length in the transverse direction (X). For example, the opening portion 51a can have four inner walls, each of which is arranged to constitute at least a part of one side of a rectangle, and, among the inner walls constituting the opening portion 51a, inner walls adjacent to each other can be connected by a curved surface. For example, the opening portion 51a has a substantially rectangular shape, but two inner walls adjacent to each other do not necessarily intersect with each other at the right angle.

Furthermore, the wearing member 50 can include a linear portion that surrounds the opening portion 51a, e.g. the seating portion 51. The first and second wearing members 53 and 55 extend away from each other from peripheries of the opening portion 51a, e.g. at least a part of the seating portion 51, along the longitudinal direction (Y) of the main unit 10. However, considering that the electronic device 1 is worn on the user's body, the first and second wearing members 53 and 55 can be bent in the thickness direction (Z) of the main unit 10 with regard to the seating portion 51. As the first and second wearing members 53 and 55 are coupled to each other, the wearing member 50 can maintain the shape of a closed curved line, as illustrated in FIG. 2, while the device is worn on the user's body.

The wearing member 50 includes a means for binding and fastening the first and second wearing members 53 and 55 to each other. For example, the first wearing member 53 can be provided with at least one binding protrusion 53a, and the second wearing member 55 can have multiple binding holes 55a formed thereon. The binding holes 55a are arranged in the direction of extension of the second wearing member 55, and can engage with the binding protrusion 53a. As the binding protrusion 53a engages with one of the binding holes 55a and binds the first and second wearing members 53 and 55 to each other, the wearing member 50 can maintain the shape of a closed curved line. The binding protrusion 53a can be integrally shaped together with the first wearing member 53, or can be fabricated as a separate component and assembled to the first wearing member 53.

When wearing the electronic device 1, the user can select the position of a binding hole 55a, with which the binding protrusion 53a engages, considering the size, curvature, and the like, of the portion on which the device is to be worn.

According to various embodiments, the wearing member of the electronic device 1 can be configured as a band that has elasticity and has the shape of a closed curved line. When the wearing member of the electronic device 1 is configured as a band that has elasticity and has the shape of a closed curved line, the user can expand the wearing member forcibly and position a desired body part inside the wearing member, thereby wearing the electronic device 1. Given that the main unit 10 is configured to be attached to and detached from the wearing member, if the user owns both the wearing member 50 having the shape as illustrated in FIG. 1, for example, and a wearing member configured as a band structure having the shape of a closed curved line, the user can mount the main unit 10 on a wearing member, which conforms to the use environment, and use the device. Besides, the structure or the shape of the wearing member 50 can be implemented variously.

The above-mentioned binding structure is just one of various embodiments of the present disclosure, and can be replaced with different, various structures (e.g. binding structures of buckle and hook types) according to the material and structure of the first and second wearing members 53 and 55.

The electronic device 1 can have a binding recess 11a formed along the periphery of the side surface, among surfaces of a main housing 11 constituting the main unit 10, and a seating portion 51 formed on the periphery of the opening portion 51a of the wearing member 50 and fitted to the binding recess 11a. The electronic device 1 further includes a fastening member for fixing the main unit 10 to the wearing member 50 more firmly after the main unit 10 is fitted to the wearing member 50. The fastening member will be described later in more detail.

The main unit 10, e.g. the main housing 11, can have the shape having a curvature. Since the seating portion 51 is made of an elastic material and undergoes elastic deformation, it can deform in conformity with the shape of the main unit 10, e.g. the shape of the binding recess 11a, and couple thereto. When the wearing members 50 are implemented in various designs or colors, the user can select/replace and use a wearing member 50 having a design or color conforming to the user's preferences. That is, the wearing member 50 can be used as an accessory that exhibits the user's own individuality. In addition, the main unit 10 has a shape corresponding to that of the seating portion 51 (or the opening portion 51a), e.g. a substantially rectangular shape, so that the electronic device 1 can activate different, various functions according to the direction in which the main unit 10 is coupled to the wearing member 50. Such activation of different functions according to the direction in which the main unit 10 is coupled will be described later in more detail.

In general, each user has a different size of the wrist, for example, the curvature. When users having different wrist curvatures wear electronic devices of the same size, they feel different. For example, women generally have thinner wrists than men, so that not all users feel comfortable when wearing the same body-wearable electronic devices. However, the electronic device 1 according to various embodiments of the present disclosure includes a main unit 10 and a wearing member 50 attached to and detached from each other so that the user can select a wearing member 50, which conforms to his/her physical characteristics, and feel comfortable when wearing it.

Although the display device 13 is illustrated in a shape that reflects the curved surface of the user's body, it can be configured as a flat (LCD, OLED) display, a curved display, or a flexible display. For example, the main unit 10 according to detailed embodiments of the present disclosure is illustrated as having a curved display, but the main unit 10 can be configured as a flat display or a flexible display according to its exterior design. The display device 13 can be integrated with a touch panel to implement a touch screen.

Figure 3:
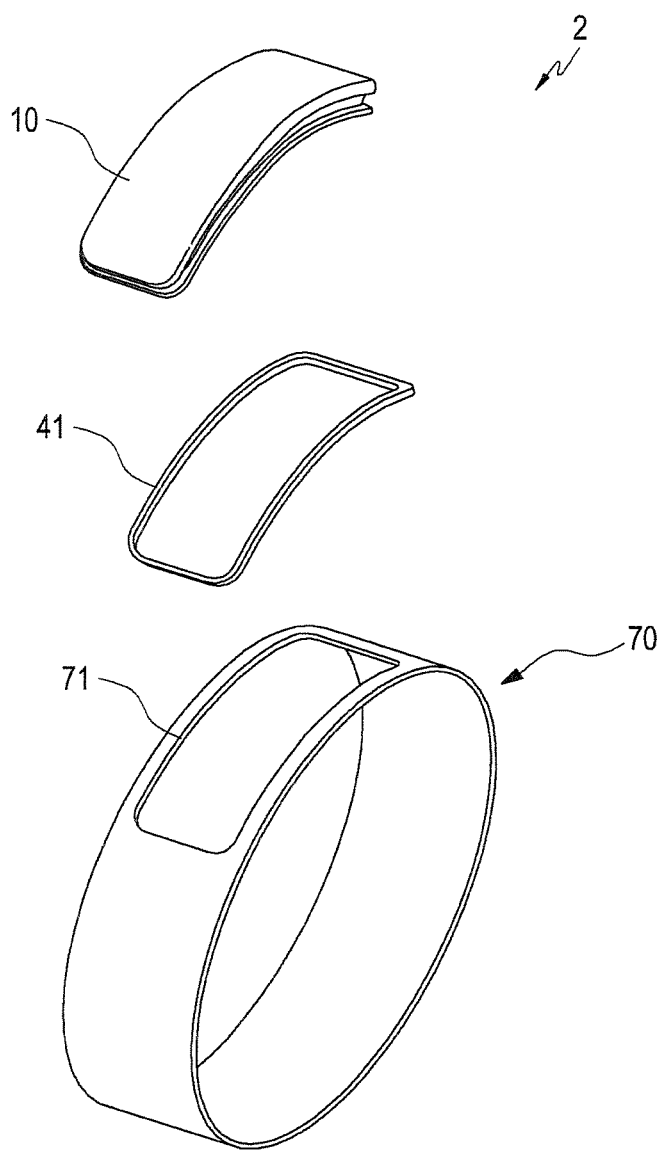
FIG. 3 is a perspective view illustrating a main unit of an electronic device when the main unit is separated from a wearing member according to embodiments of the present disclosure.
Figure 4:
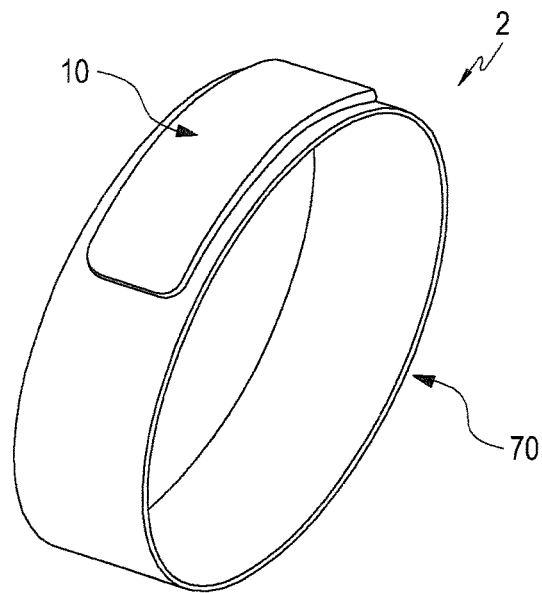
FIG. 4 is a perspective view illustrating the electronic device when the device is worn according to embodiments of the present disclosure.

FIG. 3 is a perspective view illustrating a main unit of an electronic device when the main unit is separated from a wearing member according to embodiments of the present disclosure. FIG. 4 is a perspective view illustrating the electronic device when the device is worn according to embodiments of the present disclosure.

It is to be noted that, in the following description of electronic devices according to various embodiments of the present disclosure, components that are identical to those in the preceding embodiment or that can be easily understood from the preceding embodiment, except for minor differences in their shapes and the like, are given the same reference numerals or omitted, without repeating detailed descriptions thereof.

Referring to FIG. 3 and FIG. 4, a wearing member 70 of an electronic device 2 according to the present embodiment further includes a fastening member 41 made of a different kind of material. Although the wearing member 70 according to the present embodiment is implemented in a ring shape, it can include first and second wearing members, as in the preceding embodiment, and can be selectively deformed to a ring shape (or closed curved line shape).

The fastening member 41 can be made of a material different from that of the seating portion 71 or the wearing band. For example, when the seating portion 71 or the wearing band is made of an elastic material (flexible material), the fastening member 41 can be made of a material that is more rigid than that of the seating portion 71 or the wearing band. For example, the fastening member 41 can be made of a synthetic resin including polycarbonate or a conductive metal. The fastening member 41 can be arranged on the inner surface of the seating portion 71 through processes including assembly, gluing, double injection, and insert injection. The fastening member 41 can provide a firmer bonding force between the seating portion 71 and the main unit 10 and can alleviate or prevent wearing down or a relaxation of the seating portion 71 as a result of repeated attachment and detachment of the main unit 10 for a long period of time. The fastening member 41 can be fixed to the inner surface of the seating portion 71 through double injection and, when the main unit 10 is coupled, can be fully contained in the side surface of the main unit 10.

According to a different embodiment, the fastening member can be used as a decorative element of the electronic device.

Figure 5:
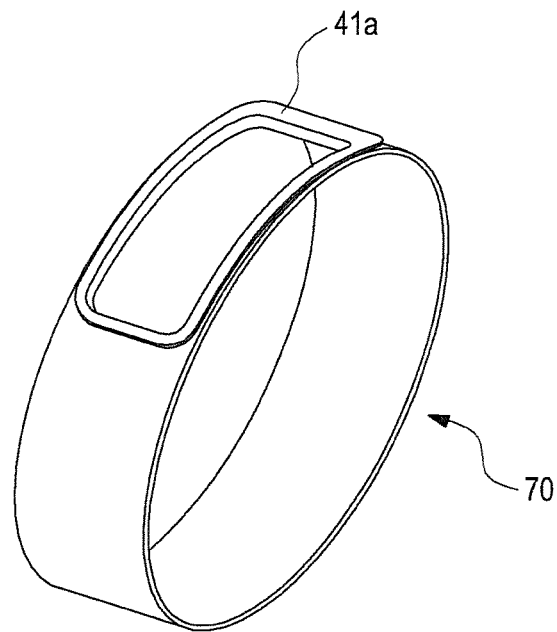
FIG. 5 is a perspective view illustrating a variant of the wearing member of the electronic device according to embodiments of the present disclosure.
Figure 6:
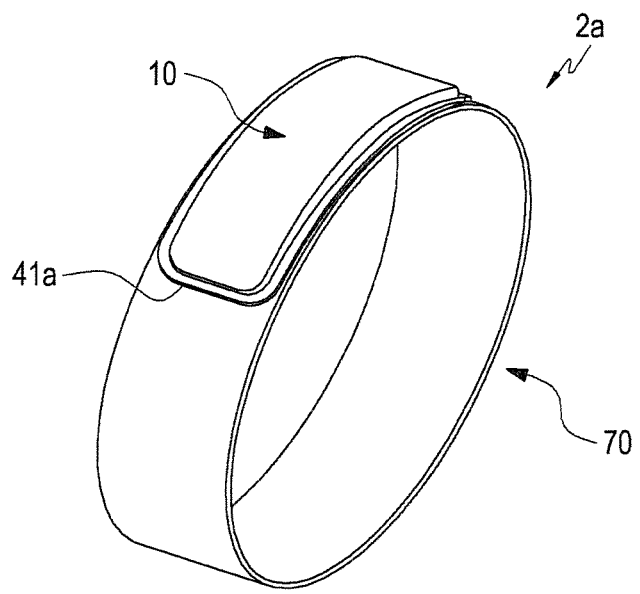
FIG. 6 is a perspective view illustrating a variant of the electronic device according to embodiments of the present disclosure.

FIG. 5 is a perspective view illustrating a variant of the wearing member of the electronic device according to embodiments of the present disclosure. FIG. 6 is a perspective view illustrating a variant of the electronic device according to embodiments of the present disclosure.

The fastening member 41 according to the preceding embodiment is fully contained in the main unit 10 and thus is not exposed to the outside; however, the fastening member 41a according to the present embodiment, as illustrated in FIG. 5 and FIG. 6, can be exposed to the periphery of the front surface of the main unit 10 between the main unit 10 and the wearing member 70, even when the main unit 10 is coupled to a part thereof. Therefore, the fastening member 41a can be used as a decorative element of the electronic device 2a by using its color or shape, by fabricating the fastening member 41a using a synthetic resin including a fluorescent substance, or by adding a light-emitting diode, for example. As such, various decorative effects can be implemented using the fastening member 41a according to the material of the fastening member 41a or the device (e.g. light-emitting diode) added to the fastening device 41a.

Figure 7:
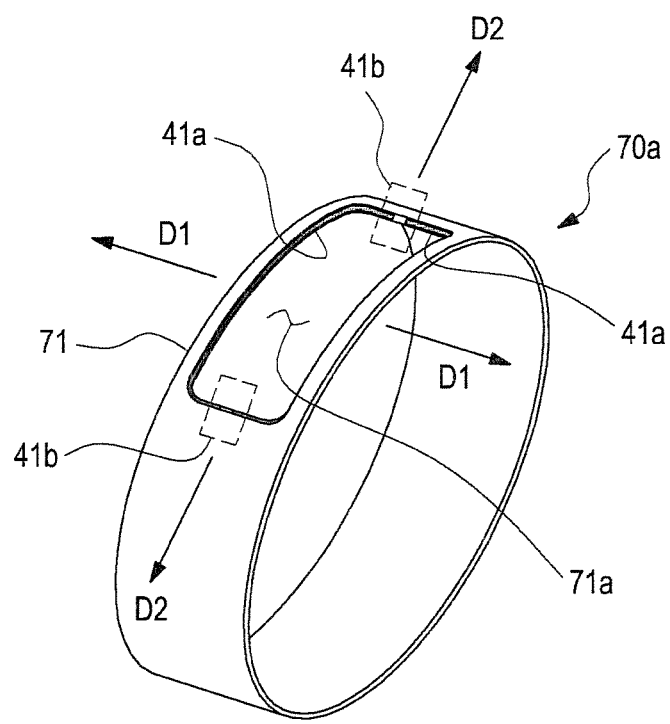
FIG. 7 is a perspective view illustrating another variant of the wearing member of the electronic device according to embodiments of the present disclosure.

FIG. 7 is a perspective view illustrating another variant of the wearing member of the electronic device according to embodiments of the present disclosure.

Referring to FIG. 7, the wearing member 70 is provided with at least one pair of fastening members 41a. The plurality of fastening members 41a can be arranged along the inner wall of the opening portion 71a. The wearing member 70a according to the present embodiment is illustrated as including a pair of fastening members 41a. In connection with arranging the fastening members 41a, slits 41b can be formed between the fastening members 41a, respectively. The slits 41b can be arranged at both ends of the opening portion 71a in the longitudinal direction, respectively. When the fastening members 41a are made of a rigid material (e.g. polycarbonate, conductive metal), the fastening members 41a can allow the seating portion 71 to deform in one direction only. For example, as illustrated in FIG. 7, the seating portion 71 can be deformed by a tension force D1 acting on it in the transverse direction, but the fastening members 41a can suppress deformation of the seating portion 71 caused by a tension force D2 acting in the longitudinal direction. The direction in which the wearing member can be deformed by a tension force can be variously set according to the number and position of the slits 41b (alternatively, according to the number and position of the fastening members 41a).

A detailed embodiment of the present disclosure illustrates a structure wherein a plurality of fastening members are arranged with slits positioned between them so that the seating portion is not allowed to deform in a predetermined direction, but is allowed to deform in other directions. However, the present disclosure is not limited thereto. For example, one fastening member having the shape of a closed curved line is arranged, and a partial range of the fastening member is made thinner than the other range, or a partial range of the fastening member is made of an elastically deformable material, thereby limiting the direction in which the seating portion can deform.

The arrangement of the fastening members 41a and the slits 41b illustrated in FIG. 7 suppresses deformation of the wearing member 70 in connection with a tension force acting while the device is worn, thereby maintaining the main unit stably coupled to the wearing member 70a. In addition, by tensioning the wearing member 70a in the transverse direction, the user can easily couple the main unit to the wearing member 70a or separate the main unit from the wearing member 70a.

Figure 8:
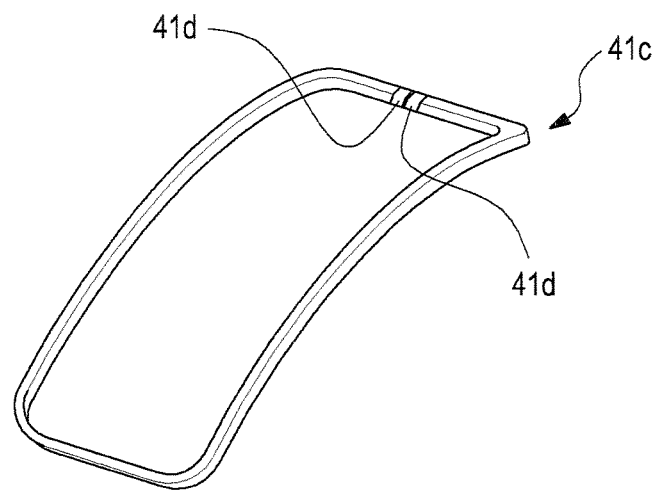
FIG. 8 is a perspective view illustrating an example of a fastening member provided on the wearing member of the electronic device according to embodiments of the present disclosure.
Figure 9:
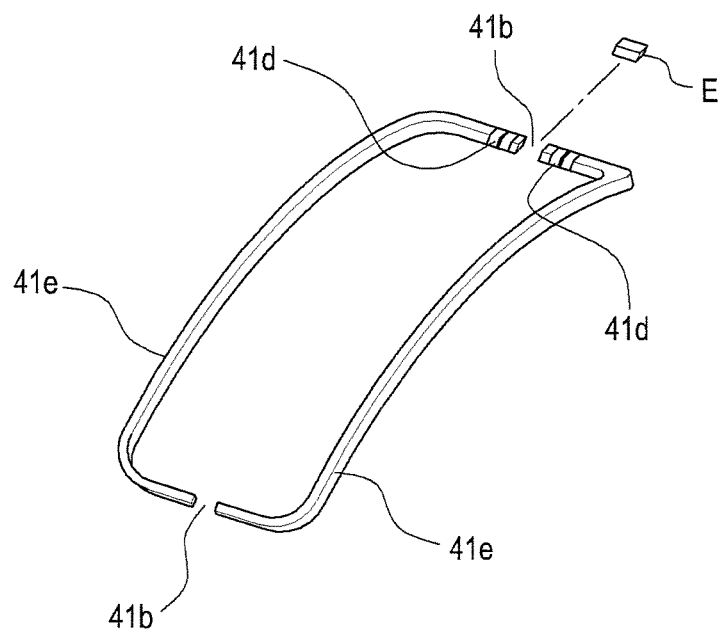
FIG. 9 is a perspective view illustrating another example of the fastening member provided on the wearing member of the electronic device according to embodiments of the present disclosure.

FIG. 8 is a perspective view illustrating an example of a fastening member provided on the wearing member of the electronic device according to a different one of various embodiments of the present disclosure. FIG. 9 is a perspective view illustrating another example of the fastening member provided on the wearing member of the electronic device according to a different one of various embodiments of the present disclosure.

The fastening members 41c and 41e illustrated in FIG. 8 and FIG. 9 are made of conductive materials, respectively, and can be electrically connected to the main unit. For example, the fastening members 41c and 41e can be used as antenna devices that expand the wireless transmission/reception function. According to an embodiment, the fastening members 41c and 41e can be provided with contact terminals 41d or magnetic bodies, respectively. The contact terminals 41d can provide electric connection between the main unit and the fastening members 41c and 41e.

Referring to FIG. 9, according to a different embodiment, assuming that a slit 41b is provided between the fastening members 41e, and the fastening members 41e are made of a transparent or semi-transparent material, a light-emitting element, such as a light-emitting diode E, can be arranged in the slit 41b. The light-emitting diode E can direct light towards each of the fastening members 41e, which are made of a transparent or semi-transparent material, and provide the periphery of the main unit with a decorative effect.

The configuration of a main unit corresponding to the fastening members 41c and 41e, which are provided with contact terminals 41d or magnetic bodies as described above, is illustrated in FIG. 10.

Figure 10:
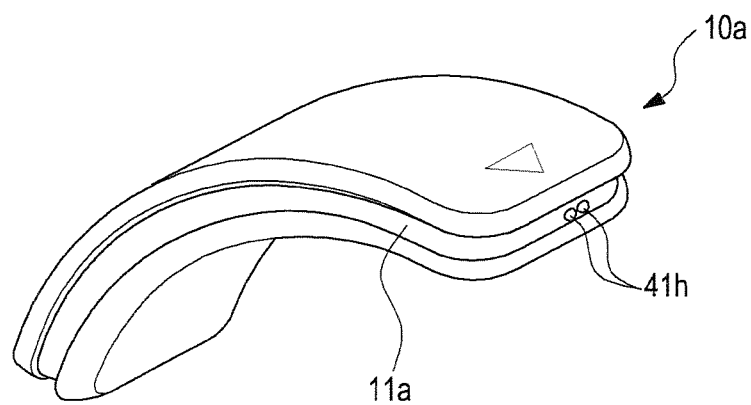
FIG. 10 is a perspective view illustrating another example of the main unit of the electronic device according to embodiments of the present disclosure.

FIG. 10 is a perspective view illustrating another example of the main unit of the electronic device according to embodiments of the present disclosure.

Referring to FIG. 8, FIG. 9, and FIG. 10, the main unit 10a corresponding to the above-mentioned fastening members 41c and 41e can have an electrode 41h arranged on a side surface, e.g. in the binding recess 11a. According to the present embodiment, the electrode 41h can be connected to the contact terminals 41d to detect whether the main unit 10a is mounted on the wearing members 70 and 70a or not or to detect the direction in which the main unit 10a is mounted with regard to the wearing members 70 and 70a. For example, when the contact terminals 41d are made of conductive pads, the electrode 41h can be electrically connected to the fastening members 41c and 41e through the contact terminals 41d. When the fastening members 41c and 41e are provided with magnetic bodies, not the contact terminals 41d, the electrode 41h can be made of a Hall sensor.

When the fastening members 41c and 41e are made of conductive materials, the fastening members 41c and 41c can be connected to the main unit 10a through the contact terminals 41d and the electrode 41h and used as antenna devices that expand the wireless transmission/reception function of the main unit 10a. In this case, the main unit 10a can activate the communication mode when it detects electric connection with the fastening members 41c and 41e while being coupled to the wearing members 70 and 70a. When the main unit 10a is separated from the wearing members 70 and 70a, or when the main unit 10a is mounted on the wearing members 70 and 70a in such a direction that the electrode 41h cannot detect the contact terminals 41d, the main unit 10a can release the communication mode and prevent battery consumption. Besides, the electrode 41h (or Hall sensor) and the contact terminals 41d (or magnetic bodies) can be used to detect the direction in which the main unit 10a is mounted, thereby setting the operating mode variously.

According to various embodiments, the fastening members 41, 41a, 41c, and 41e can be, besides the configurations of using them to expand the antenna device and using them as decorations using light-emitting diodes, useful to improve the function or performance of the electronic device 1. For example, the battery capacity can be limited because there is a limit to the space that can be secured in the main unit 10; in such a case, the fastening members 41, 41a, 41c, and 41e can be used to expand the battery capacity of the electronic device 1. In addition, when the fastening members 41, 41a, 41c, and 41e can be electrically connected to the main unit 10 through the above-mentioned electrode 41h and the contact terminals 41d, the fastening members 41, 41a, 41c, and 41e can be equipped with connectors, for example, to expand the connection device of the electronic device 1. Besides, the fastening members 41, 41a, 41c, and 41e can be equipped with various sensors to further diversify the function of the electronic device 1. For example, when the fastening members 41, 41a, 41c, and 41e are equipped with bio-signal detection sensors that can detect the user's heartbeat, blood pressure, oxygen saturation, etc., suitable applications can be installed to use the electronic device 1 to manage the user's health.

When the user owns a plurality of wearing members including fastening members 41, 41a, 41c, and 41e equipped with different sensors, the user can select a suitable wearing member as needed and mount the main unit 10 thereon. For example, the user can select a suitable wearing member as needed and mount the main unit 10 thereon, thereby utilizing the electronic device 1 more diversely.

According to various embodiments, the operating mode of the main unit 10 can be varied according to the direction in which the main unit 10 is mounted with regard to the fastening members 41, 41a, 41c, and 41e, thereby providing various user experiences. In the electronic device 1, the main unit 10 can be rotated by 180° and mounted on the wearing member 50 in two different positions. For example, the electronic device 1 can be set in a normal mode, in which the device is used in a comparatively static state, e.g. voice communication, messages/information checkup, in the first mounting position of the main unit 10 and set in an active mode, in which the view is limited by fast movements, e.g. workout, driving, in the second mounting position, which the main unit 10 reaches after rotating 180° from the first mounting position. In the normal mode, the display device and the like can be fully utilized to output information required by the user, and, in the active mode, information output can be adjusted according to the user's setting and the like, e.g. the sound output function can be enhanced.

The direction in which the main unit 10 is mounted with regard to the fastening members 41, 41a, 41c, and 41e can be recognized by a combination of the above-mentioned electrode 41h, the contact terminals 41d or magnetic bodies, and the Hall sensor. It will be assumed that at least one of the fastening members 41, 41a, 41c, and 41e is used as a part of the antenna device; when the main unit 10 and the fastening member used as a part of the antenna device are connected, a communication mode (e.g. the normal mode) can be activated, and, when the fastening member used as a part of the antenna device is not connected to the main unit 10, the communication mode can be deactivated to prevent battery consumption.

Figure 11:
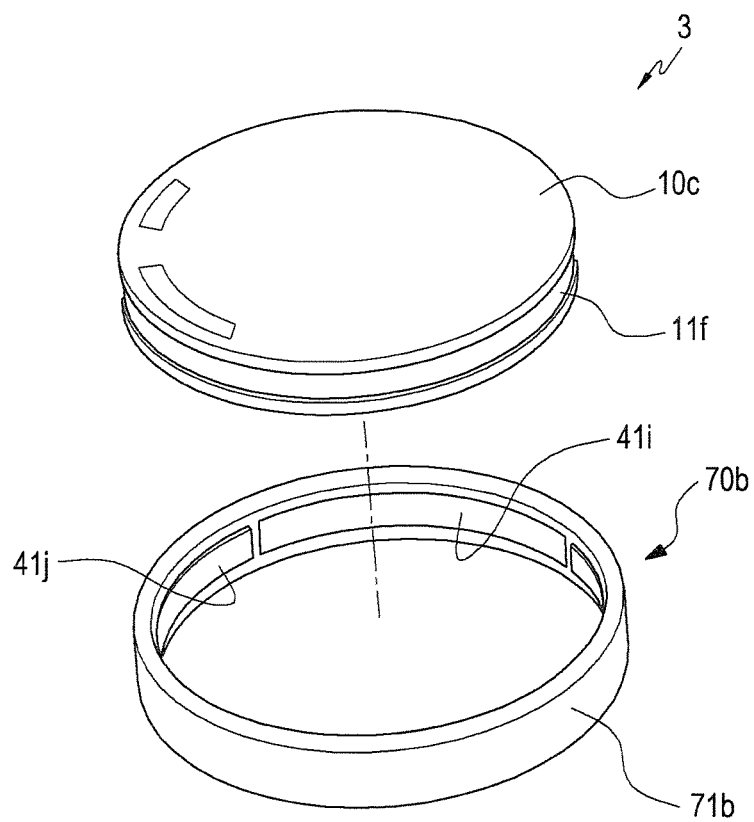
FIG. 11 is a perspective view illustrating a main unit of an electronic device according to embodiments of the present disclosure, when the main unit is separated from a wearing member.

FIG. 11 is a perspective view illustrating a main unit of an electronic device according to embodiments of the present disclosure, when the main unit is separated from a wearing member.

The wearing member 70b of the electronic device 3 according to a still different one of various embodiments of the present disclosure can be implemented in the shape of a pendant. For example, the seating portion 71b of the wearing member 70b can be implemented in an annular shape, and a wearing member (not illustrated) of a necklace shape can extend from the seating portion 71b. Fastening members 41i and 41j made of a material different from that of the seating portion 71b can be arranged on the inner surface of the seating portion 71b. When a plurality of fastening members 41i and 41j are arranged on the inner surface of the seating portion 71b, the seating portion 71b is allowed to expand in response to a tension force acting in a specific direction, but expansion is suppressed in response to tension forces acting in other directions. The main unit 10c of the electronic device 3 can have the shape of a disk surrounded by the seating portion 71b. The main unit 10c can have a binding recess 11f formed on its side surface in a shape corresponding to that of the seating portion 71b. Although not illustrated, assuming that contact terminals (or magnetic bodies) are arranged on the fastening members 41j and the main unit 10c is provided with corresponding sensors, the operating mode of the main unit 10c can be set differently according to the position or direction of coupling of the main unit 10c.

Figure 12:
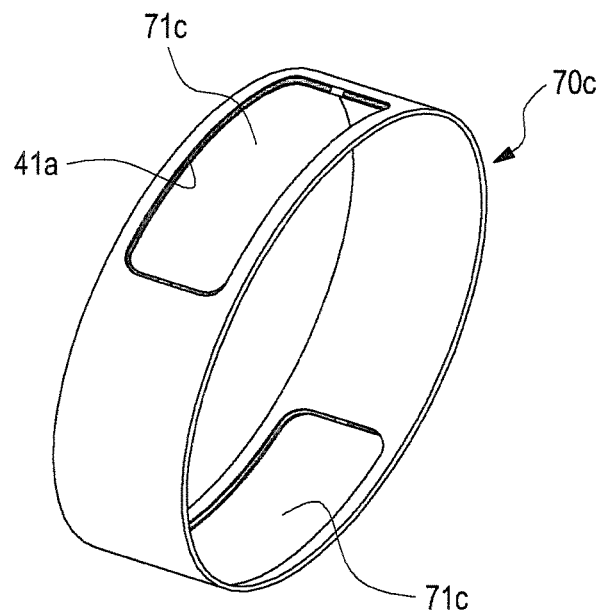
FIG. 12 is a perspective view illustrating a wearing member of the electronic device according to embodiments of the present disclosure.
Figure 13:
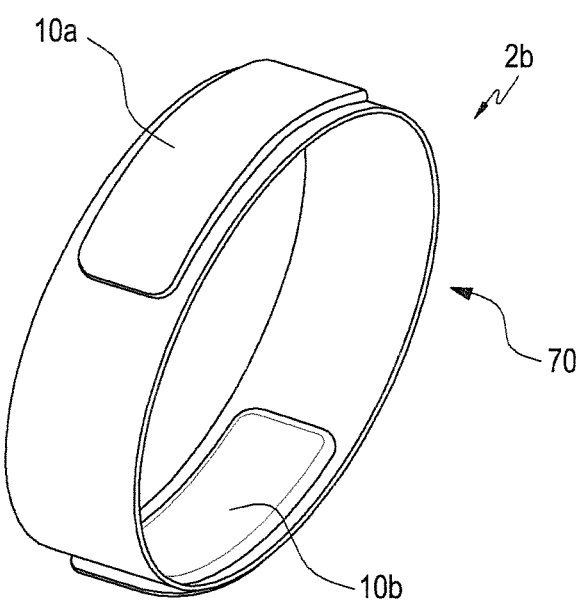
FIG. 13 is a perspective view illustrating the electronic device according to embodiments of the present disclosure.

FIG. 12 is a perspective view illustrating a wearing member of the electronic device according to embodiments of the present disclosure. FIG. 13 is a perspective view illustrating the electronic device according to a still different one of various embodiments of the present disclosure.

Referring to FIG. 12 and FIG. 13, the electronic device 2b according to the present embodiment can have a plurality of opening portions 71c provided on the wearing member 70c. Therefore, the electronic device 2b further includes a second main unit 10b besides the main unit 10a. The second main unit 10b can not only be configured in the same manner as the main unit 10a, but also be configured to have a different function. When configured in the same manner as the main unit 10a, the second main unit 10b can expand the memory capacity or the display area, and the second main unit 10b can interwork with the main unit 10a in a wired or wireless manner or operate independently to simultaneously drive various applications. In addition, the second main unit 10b can expand the capacity of the calculation device or the battery, provide an auxiliary storage device, or add various switches or sensors, which are not mounted on the main unit 10a, to the electronic device 2b. For example, when the electronic device 2b has a bio-signal detection sensor but is in an environment where it cannot secure a sufficient amount of light to recognize a vein, etc., the second main unit 10b can be used to supply the lacking amount of light.

Figure 14:
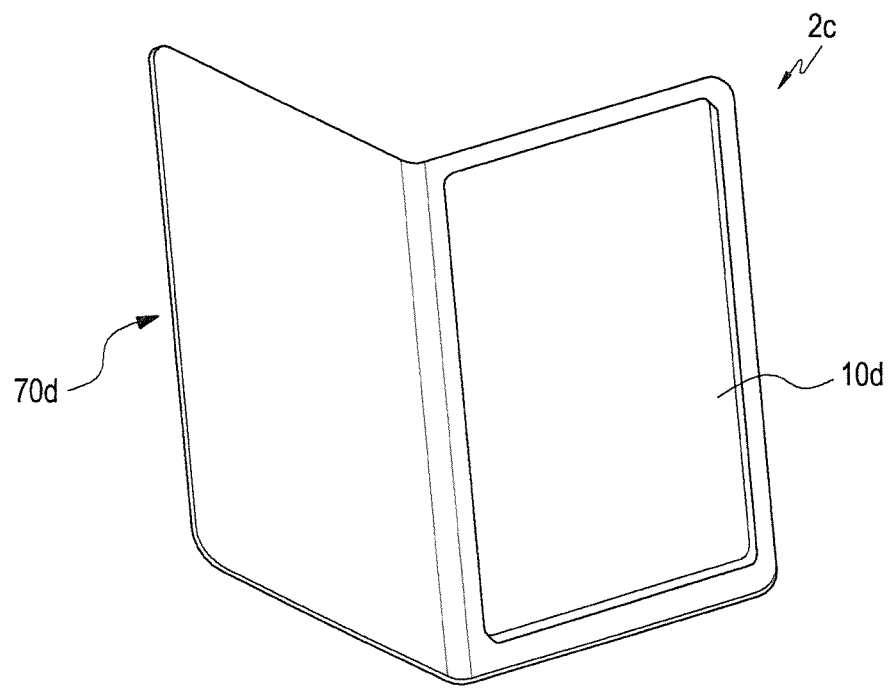
FIG. 14 is a perspective view illustrating the electronic device according to embodiments of the present disclosure.
Figure 15:
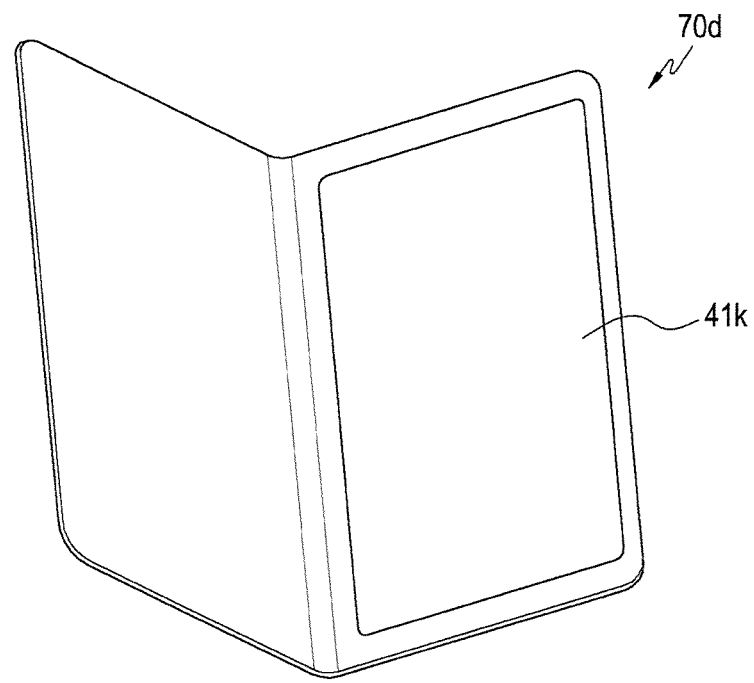
FIG. 15 is a perspective view illustrating a cover unit of the electronic device according to embodiments of the present disclosure.
Figure 16:
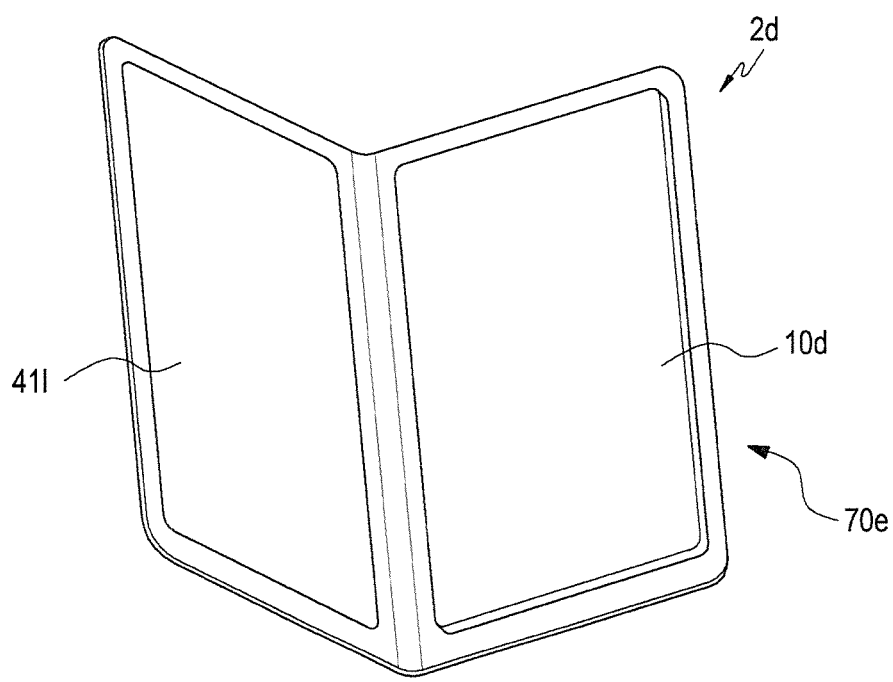
FIG. 16 is a perspective view illustrating a variant of the electronic device according to embodiments of the present disclosure.

FIG. 14 is a perspective view illustrating the electronic device according to embodiments of the present disclosure. FIG. 15 is a perspective view illustrating a cover unit of the electronic device according to embodiments of the present disclosure. FIG. 16 is a perspective view illustrating a variant of the electronic device according to embodiments of the present disclosure.

Although a body-wearable electronic device has been described in the preceding embodiments in connection with description of detailed embodiments of the present disclosure, the present disclosure is not limited thereto. For example, various embodiments of the present disclosure can also be applied to commercialized bar-type electronic devices.

Referring to FIG. 14 to FIG. 16, the main unit of the electronic device 2c can be implemented as a bar-type mobile communication terminal 10d, and the wearing member can be replaced with cover members 70d and 70e configured to be attached to and detached from the terminal 10d. The cover members 70d and 70e can be mounted and fixed to the rear surface of the terminal 10d to open and close the front surface of the terminal 10d. The cover members 70d and 70e includes additional devices 41k and 41l on the inner surface thereof, e.g. first surface that is attached to and detached from the rear surface of the terminal 10d, or a second surface that opens and closes the front surface of the terminal 10d. The additional devices 41k and 41l include a near field communication (NFC) antenna, an auxiliary battery, an auxiliary storage device, etc. In addition, when the cover members 70d and 70e include a seating portion that is bound to the terminal 10d, the additional devices 41k and 41l can be arranged on the seating portion of the cover members 70d and 70e. As implemented in the preceding embodiments, the auxiliary devices 41k and 41l and the terminal 10d can interwork to make various settings, e.g. to differently set the operating mode of the terminal 10d according to the direction in which the terminal 10d is mounted on the cover members 70d and 70e.

Figure 17:
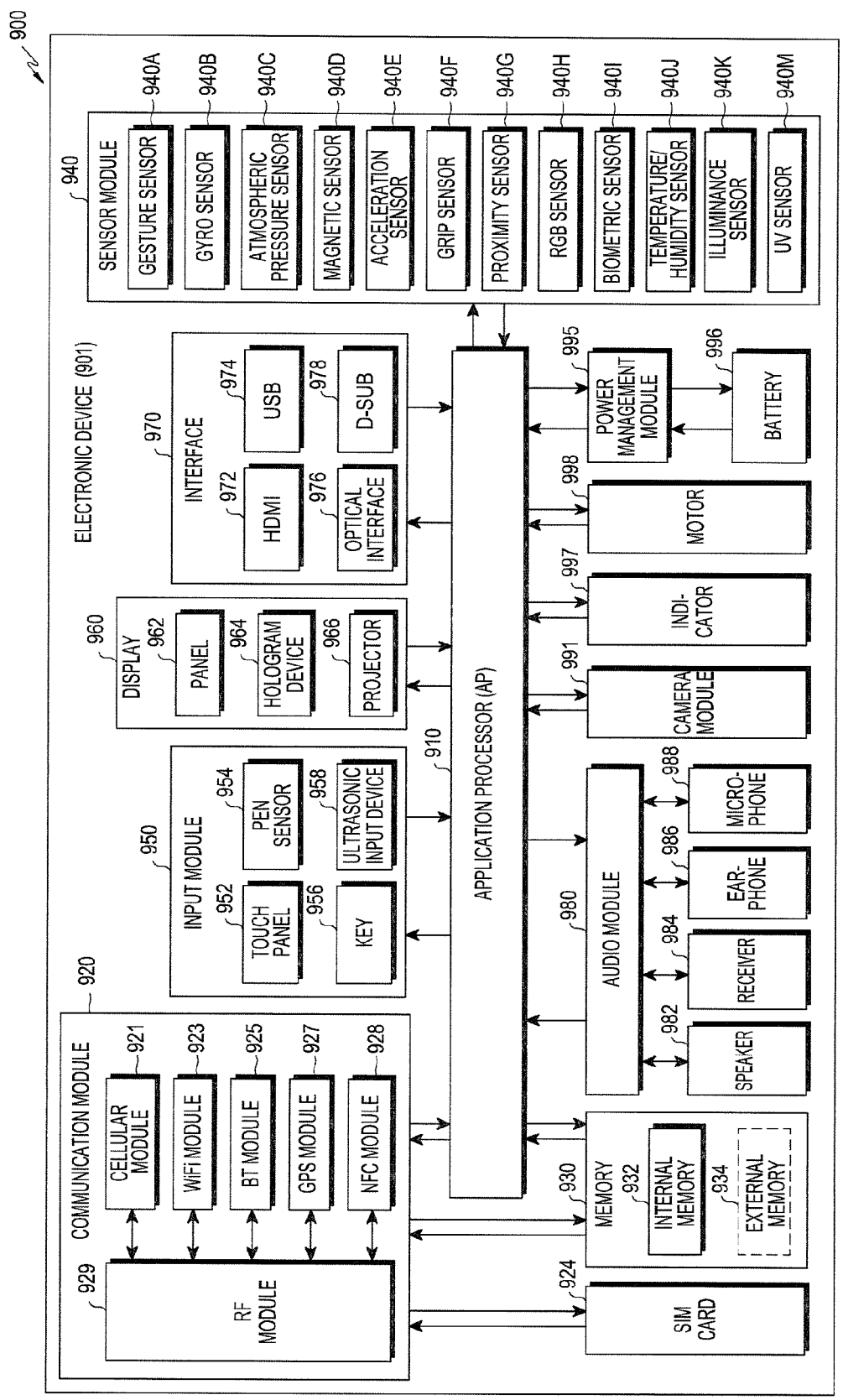
FIG. 17 is a block diagram illustrating an electronic device according to embodiments of the present disclosure.

FIG. 17 is a block diagram illustrating an electronic device according to embodiments of the present disclosure.

Referring to FIG. 17, the electronic device 100 can constitute, for example, all or a part of the above-mentioned electronic devices 1, 2, 2a, 2b, 2c, 2d, and 3. The electronic device 100 can include at least one of: at least one AP (application processor) 910, a communication module 920, a SIM (subscriber identification module) card 924, a memory 930, a sensor module 940, an input device 950, a display 960 (e.g. the display device 13), an interface 970, an audio module 980, a camera module 991, a power management module 995, a battery 996, an indicator 997, and a motor 998.

The AP 910 controls a plurality of hardware or software components connected to the AP 910 by driving an operating system or an application program, process various data including multimedia data, and perform calculations. The AP 910 can be embodied as, for example, a System on Chip (SoC). According to an embodiment, the AP 910 further includes a Graphic Processing Unit (GPU).

The communication module 920 (e.g. the communication interface 160) can perform data transmission/reception in connection with communication with other electronic devices connected to the electronic device 100 via a network. According to one embodiment, the communication module 920 includes at least one of: a cellular module 921, a Wi-Fi module 923, a BT module 925, a GPS module 927, an NFC module 928, and a Radio Frequency (RF) module 929.

The cellular module 921 provides a voice call, a video call, a text message service, or an Internet service through a communication network (for example, LTE, LTE-A, CDMA, WCDMA, UMTS, WiBro, GSM or the like). Further, the cellular module 921 distinguishes and authenticates electronic devices within a communication network by using a subscriber identification module (for example, the SIM card 924). According to an embodiment, the cellular module 921 performs at least some of functions that the AP 910 provides. For example, the cellular module 921 can perform at least a part of a multimedia control function.

According to an embodiment, the cellular module 921 includes a Communication Processor (CP). Further, the cellular module 921 can be implemented by, for example, an SoC. Although components such as the cellular module 921 (e.g., the communication processor), the memory 930, or the power management module 995 are illustrated to be separate from the AP 910 in FIG. 17, the AP 910 can be implemented to include at least some of the above described components (e.g., the cellular module 921) according to one embodiment.

According to an embodiment, the AP 910 or the cellular module 921 (for example, communication processor) can load a command or data received from at least one of a non-volatile memory and other components connected to each of them to a volatile memory and process the loaded command or data. Further, the AP 910 or the cellular module 921 can store data received from or generated by at least one of the other components in a non-volatile memory.

Each of the Wi-Fi module 923, the BT module 925, the GPS module 927, and the NFC module 928 can include, for example, a processor for processing data transmitted/received through the corresponding module. In FIG. 17, the cellular module 921, the WiFi module 923, the BT module 925, the GPS module 927, and the NFC module 928 are illustrated as blocks separated from each other, but, according to an embodiment, at least some (for example, two or more) of the cellular module 921, the WiFi module 923, the BT module 925, the GPS module 927, and the NFC module 928 can be included in one Integrated Chip (IC) or one IC package. For example, at least some (for example, a communication processor corresponding to the cellular module 921 and a Wi-Fi processor corresponding to the Wi-Fi module 923) of the processors corresponding to the cellular module 921, the Wi-Fi module 923, the BT module 925, the GPS module 927, and the NFC module 928, respectively, can be implemented by a single SoC.

The RF module 929 transmits and receives data, for example, an RF signal. Although not illustrated, the RF module 929 includes, for example, a transceiver, a Power Amplifier Module (PAM), a frequency filter, a Low Noise Amplifier (LNA), or the like. Further, the RF module 929 further includes a component for transmitting/receiving an electromagnetic wave in a free space during a radio communication, such as a conductor or a conducting wire. Although the cellular module 921, the Wi-Fi module 923, the BT module 925, the GPS module 927, and the NFC module 928 are illustrated to share one RF module 929 in FIG. 17, at least one of the cellular module 921, the Wi-Fi module 923, the BT module 925, the GPS module 927, and the NFC module 928 transmits and receives RF signals through a separate RF module.

The SIM card 924 is a card including a subscriber identification module, and can be inserted into a slot formed in a particular portion of the electronic device. The SIM card 924 includes unique identification information (for example, Integrated Circuit Card Identifier (ICCID)) or subscriber information (for example, International Mobile Subscriber Identity (IMSI)).

The memory 930 (for example, memory 130) includes an internal memory 932 or an external memory 934. The internal memory 932 includes at least one of a volatile memory (for example, a Dynamic RAM (DRAM), a Static RAM (SRAM), a Synchronous Dynamic RAM (SDRAM), and the like) and a non-volatile memory (for example, a One Time Programmable ROM (OTPROM), a Programmable ROM (PROM), an Erasable and Programmable ROM (EPROM), an Electrically Erasable and Programmable ROM (EEPROM), a mask ROM, a flash ROM, a NAND flash memory, a NOR flash memory, and the like).

According to an embodiment, the internal memory 932 is a Solid State Drive (SSD). The external memory 934 can further include a flash drive, for example, a Compact Flash (CF), a Secure Digital (SD), a Micro Secure Digital (Micro-SD), a Mini Secure Digital (Mini-SD), an extreme Digital (xD), a memory stick or the like. The external memory 934 can be functionally connected to the electronic device 100 through various interfaces. According to an embodiment, the electronic device 100 further includes a storage device (or storage medium) such as a hard drive.

The sensor module 940 measures a physical quantity or detects an operation state of the electronic device 100, and converts the measured or detected information to an electronic signal. The sensor module 940 includes, for example, at least one of a gesture sensor 940A, a gyro sensor 940B, an atmospheric pressure sensor 940C, a magnetic sensor 940D, an acceleration sensor 940E, a grip sensor 940F, a proximity sensor 940G, a color sensor 940H (for example, red, green, and blue (RGB) sensor), a biometric sensor 940I, a temperature/humidity sensor 940J, a luminance sensor 940K, and an Ultra Violet (UV) sensor 940M. Additionally or alternatively, the sensor module 940 includes, for example, an E-nose sensor (not illustrated), an ElectroMyoGraphy (EMG) sensor (not illustrated), an ElectroEncephaloGram (EEG) sensor (not illustrated), an ElectroCardioGram (ECG) sensor (not illustrated), an InfraRed (IR) sensor, an iris sensor (not illustrated), a fingerprint sensor (not illustrated) and the like. The sensor module 940 further includes a control circuit for controlling one or more sensors included therein.

The input device 950 includes a touch panel 952, a (digital) pen sensor 954, a key 956, or an ultrasonic input device 958. The touch panel 952 recognizes a touch input through at least one of, for example, a capacitive scheme, a resistive scheme, an infrared scheme, and an ultrasonic scheme. The touch panel 952 further includes a control circuit. The capacitive scheme touch panel recognizes physical contact or proximity. The touch panel 952 further includes a tactile layer. In this case, the touch panel 952 provides a tactile reaction to a user.

The (digital) pen sensor 954 can be embodied, for example, using a method identical or similar to a method of receiving a touch input of a user, or using a separate recognition sheet. The key 956 includes, for example, a physical button, an optical key or a keypad. The ultrasonic input device 958 has an input tool, which generates ultrasonic signals, so that the electronic device 100 senses sound waves using the microphone 988 and identifies data, and is capable of wireless recognition. According to an embodiment, the electronic device 100 receives a user input from an external device (for example, computer or server) connected thereto by using the communication module 920.

The display 960 (e.g. the display device 13) includes a panel 962, a hologram device 964, or a projector 966. The panel 962 can be, for example, a Liquid Crystal Display (LCD), Active-Matrix Organic Light Emitting Diode (AMOLED), or the like. The panel 962 can be embodied to be, for example, flexible, transparent, or wearable. The panel 962 can be also configured as one module together with the touch panel 952. The hologram 964 can show a stereoscopic image in the air by using interference of light. The projector 966 can project light onto a screen to display an image. For example, the screen can be located inside or outside the electronic device 100. According to one embodiment, the display 960 can further include a control circuit for controlling the panel 962, the hologram device 964, or the projector 966.

The interface 970 includes, for example, a High-Definition Multimedia Interface (HDMI) 972, a Universal Serial Bus (USB) 974, an optical interface 976, or a D-subminiature (D-sub) 978. Additionally or alternatively, the interface 970 includes, for example, a Mobile High-definition Link (MHL) interface, a Secure Digital (SD) card/Multi-Media Card (MMC) interface, or an Infrared Data Association (IrDA) standard interface.

The audio module 980 bi-directionally converts a sound and an electronic signal. At least some of the components of the audio module 980 can be included in the input/output interface. The audio module 980 processes voice information input or output through, for example, a speaker 982, a receiver 984, earphones 986, the microphone 988 or the like.

The camera module 991 is a device which can photograph an image and a dynamic image. According to an embodiment, the camera module 291 includes one or more image sensors (for example, a front sensor or a back sensor), a lens (not shown), an Image Signal Processor (ISP) (not shown) or a flash (not shown) (for example, LED or xenon lamp).

The power management module 995 manages power of the electronic device 100. Although not illustrated, the power management module 995 includes, for example, a Power Management Integrated Circuit (PMIC), a charger Integrated Circuit (IC), or a battery or fuel gauge.

The PMIC can be mounted to, for example, an integrated circuit or an SoC semiconductor. Charging methods can be classified into a wired charging method and a wireless charging method. The charger IC charges a battery and prevents over voltage or over current from being flowed from a charger. According to an embodiment, the charger IC includes a charger IC for at least one of the wired charging method and the wireless charging method. A magnetic resonance scheme, a magnetic induction scheme, or an electromagnetic scheme can be exemplified as the wireless charging method, and an additional circuit for wireless charging, such as a coil loop circuit, a resonance circuit, a rectifier circuit, and the like can be added.

The battery fuel gauge measures, for example, a remaining quantity of the battery 996, or a voltage, a current, or a temperature during the charging. The battery 996 stores or generates electricity, and supplies power to the electronic device 100 using the stored or generated electricity. The battery 996 can include, for example, a rechargeable battery or a solar battery.

The indicator 997 indicates particular states (e.g., a booting state, a message state, a charging state, etc.) of the electronic device 100 or a part (e.g., the AP 910) of the electronic device 900. The motor 998 converts an electrical signal to a mechanical vibration. Although not illustrated, the electronic device 100 includes a processing unit (for example, GPU) for mobile TV support. The processing unit for supporting the mobile TV processes media data according to a standard of Digital Multimedia Broadcasting (DMB), Digital Video Broadcasting (DVB), media flow or the like.

The above described components of the electronic device according to various embodiments of the present disclosure can be formed of one or more components, and a name of a corresponding component element may be changed based on the type of electronic device. The electronic device according to the present disclosure may include one or more of the aforementioned components or may further include other additional components, or some of the aforementioned components may be omitted. Further, some of the components of the electronic device according to the various embodiments of the present disclosure may be combined to form a single entity, and thus, may equivalently execute functions of the corresponding elements prior to the combination.

The "module" used in various embodiments of the present disclosure may refer to, for example, a "unit" including one of hardware, software, and firmware, or a combination of two or more of the hardware, software, and firmware. The "module" may be interchangeable with a term, such as a unit, a logic, a logical block, a component, or a circuit. The "module" may be a minimum unit of an integrated component element or a part thereof. The "module" may be a minimum unit for performing one or more functions or a part thereof. The "module" may be mechanically or electronically implemented. For example, the "module" according to various embodiments of the present disclosure may include at least one of an Application-Specific Integrated Circuit (ASIC) chip, a Field-Programmable Gate Arrays (FPGAs), and a programmable-logic device for performing operations which have been known or are to be developed hereafter.

Figure 18:
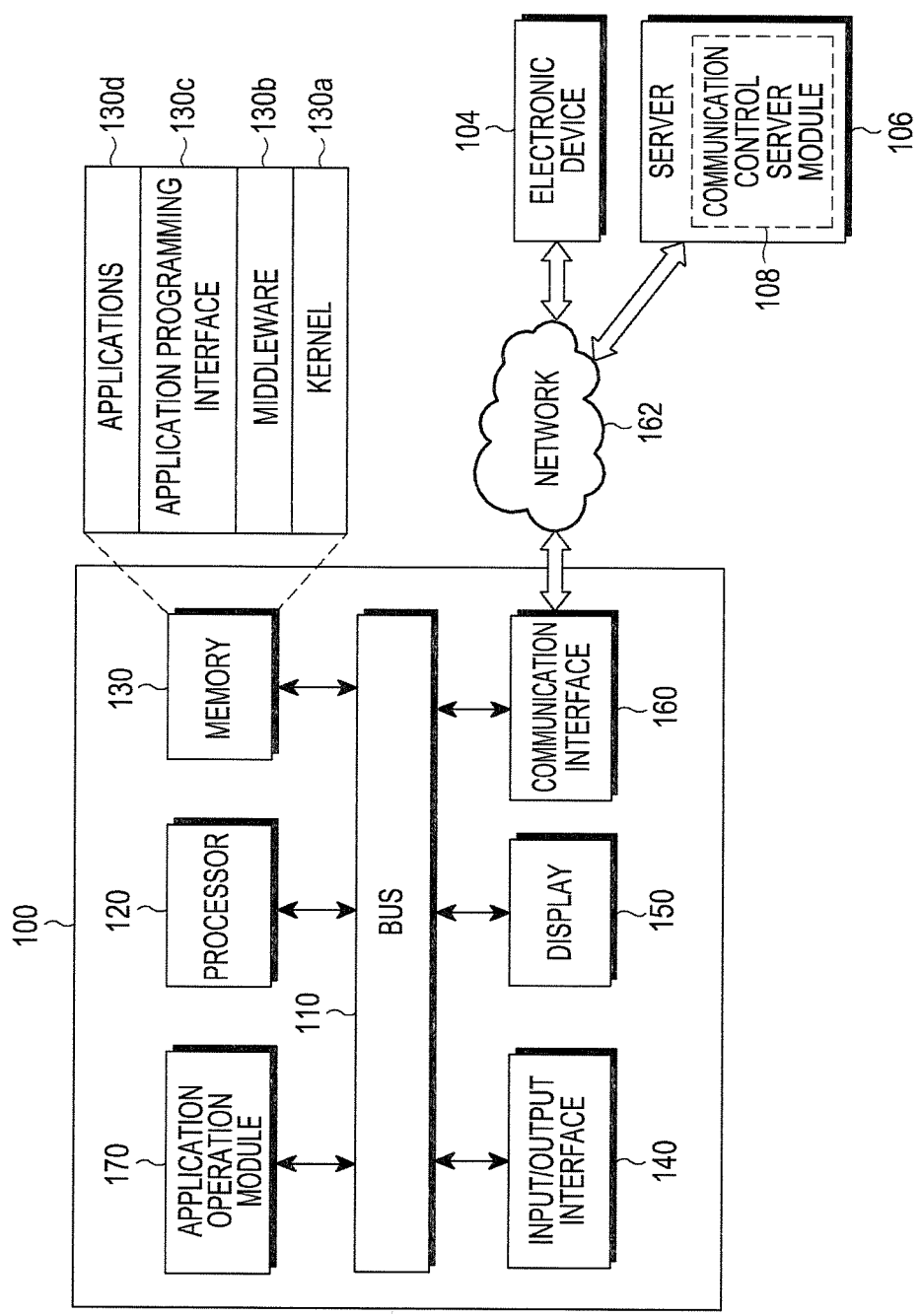
FIG. 18 is a diagram illustrating a network environment including an electronic device according to embodiments of the present disclosure.

FIG. 18 is a diagram illustrating a network environment including an electronic device according to embodiments of the present disclosure.

Referring to FIG. 18, the electronic device 100 includes a bus 110, a processor 120, a memory 130, an input/output interface 140, a display 150, a communication interface 160, and an application operation module 170.

The bus 110 is a circuit that connects the above-described components with each other and to transfer communication (for example, control messages) between the above-described components.

For example, the processor 120 can receive instructions from the aforementioned other elements (e.g., the memory 130, the input/output interface 140, the display 150, the communication interface 160, and the application operation module 170) through the bus 110, decipher the received instructions, and perform calculation or data processing according to the deciphered instructions.

The memory 130 stores instructions or data received from the processor 120 or other elements (e.g., the input/output interface 140, the display 150, the communication interface 160, the application operation module 170, or the like) or generated by the processor 120 or other elements. The memory 130 includes programming modules, such as a kernel 130a, middleware 130b, API (application programming interface) 130c, or an application 130d. Each of the programming modules described above can be formed of software, firmware, and hardware, or a combination thereof.

The kernel 130a controls or manage system resources (for example, the bus 110, the processor 120, the memory 130 or the like) which are used for performing operations or functions implemented by other programming modules, for example, the middleware 130b, the API 130c or the application 130d. Further, the kernel 130a provides an interface through which the middleware 130b, the API 130c, or the application 130d can access and control or manage individual components of the electronic device 100.

The middleware 130b serves as an intermediator that allows the API 130c or the application 130d to communicate with and exchange data with the kernel 130a. Further, in relation to requests for an operation received from the application 130d, the middleware 130b controls (for example, scheduling or load-balancing) the requests for the operation by using, for example, a method of determining sequence for using system resources (for example, the bus 110, the processor 120, the memory 130, or the like) of the electronic device 100 with respect to at least one application among the applications 130d.

The API 130c is an interface by which the application 130d controls functions provided from the kernel 130a or the middleware 130b, and includes, for example, at least one interface or function (for example, instructions) for file control, window control, image processing, or text control.

According to various embodiments, the application 130d includes a Short Message Service (SMS)/Multimedia Message Service (MMS) application, an e-mail application, a calendar application, an alarm application, a health care application (for example, an application for measuring the amount of exercise or blood sugar), an environmental information application (for example, an application for providing atmospheric pressure, humidity, or temperature), or the like. Additionally or alternatively, the application 130d can be an application related to information exchange between the electronic device 100 and an external electronic device 104. The application related to the information exchange can include, for example, a notification relay application for transmitting specific information to the external electronic device, or a device management application for managing the external electronic device.

For example, the notification relay application can include a function of transferring notification information generated in other applications (for example, the SMS/MMS application, the e-mail application, the health care application, or the environmental information application) of the electronic device 100 to the external electronic device 104. Additionally or alternatively, the notification relay application can receive the notification information from, for example, the external electronic device 104, and can provide the received notification information to a user. The device management application manages (for example, install, delete, or update), for example, at least some functions (for example, turning external electronic device (or some elements) on or off, or adjusting the brightness (or resolution) of a display) of the external electronic device 104 that communicates with the electronic device 100, applications performed in the external electronic device, or services (for example, a phone call service, or a messaging service) provided by the external electronic device.

According to various embodiments, the application 130d includes applications, which are designated according to the attribute (e.g., device type) of the external electronic device 104. For example, in a case where the external electronic device is an MP3 player, the application 130d includes an application related to the reproduction of music. Similarly, when the external electronic device is a mobile medical device, the application 130d includes an application related to health care. According to an embodiment, the application 130d includes at least one of an application designated for the electronic device 100 or an application received from a different electronic device (for example, a server 106, or an external electronic device 104).

The input/output interface 140 transmits a command or data input from the user through an input/output device (for example, sensor, keyboard, or touch screen) to the processor 120, the memory 130, the communication interface 160, or the application operation module 170 through, for example, the bus 110. For example, the input/output interface 140 provides, to the processor 120, data for a user's touch which is input through the touch screen. Further, through the input/output device (for example, a speaker or a display), the input/output interface 140 outputs commands or data received from the processor 120, the memory 130, the communication interface 160, or the application operation module 170 through the bus 110. For example, the input/output interface 140 outputs voice data processed by the processor 120 to the user through the speaker.

The display 150 displays various pieces of information (for example, multimedia data or text data) for the user.

The communication interface 160 makes a communication connection between the electronic device 100 and a different electronic device (for example, the external electronic device 104 or the server 106). For example, the communication interface 160 connects to a network 162 through wireless or wired communication to communicate with the external electronic device. The wireless communication includes, for example, at least one of Wi-Fi, Wi-Fi Direct, Bluetooth (BT), Near Field Communication (NFC), a Global Positioning System (GPS), or cellular communication (for example, LTE, LTE-A, CDMA, WCDMA, UMTS, WiBro, or GSM). The wired communication includes at least one of, for example, a Universal Serial Bus (USB), a High Definition Multimedia Interface (HDMI), Recommended Standard 232 (RS-232), and a Plain Old Telephone Service (POTS).

According to an embodiment, the network 162 can be a telecommunications network. The communication network can include at least one of a computer network, the Internet, the Internet of things, and a telephone network. According to an embodiment, protocols (for example, a transport layer protocol, a data link layer protocol, or a physical layer protocol) for communication between the electronic device 100 and external electronic devices can be supported by at least one of the application 130*d*, the API 130*c*, the middleware 130*b*, the kernel 130*a*, and the communication interface 160.

According to an embodiment, the application operation module 170 supports driving of the electronic device 100 by performing at least one of the operations (or functions) implemented by the electronic device 100. For example, the server 106 can include a communication control server module 108 capable of supporting the application operation module 170 implemented in the electronic device 100. For example, the communication control server module 108 can include at least one component of the application operation module 170, and can perform (e.g., perform as a proxy) at least one of the operations performed by the application operation module 170.

The application operation module 170 processes at least some of the information obtained from other components (for example, the processor 120, the memory 130, the input/output interface 140, or the communication interface 160) and utilize the same in various manners. For example, the application operation module 170 controls at least some functions of the electronic device 100 by using the processor 120 or independently thereof so that the electronic device 100 can interwork with a different electronic device (e.g., the external electronic device 104 or the server 106). The connection control module 170 can be integrated into the processor 120. According to an embodiment, at least one component of the application operation module 170 can be included in the server 106 (for example, the communication control server module 108) and can have at least one operation, which is performed by the application operation module 170, supported by the server 106. Additional information regarding the application operation module 170 is provided with reference to FIG. 9 described later.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A body-wearable electronic device comprising:
   a wearing member configured to be worn on a user's body;
   an opening portion formed on the wearing member;
   at least one main unit configured to be attached to and detached from the wearing member while at least a part of the at least one main unit faces the opening portion;
   a binding recess formed on a periphery of a side surface of the main unit;
   at least one fastening member provided inside the opening portion and engaged with at least a part of the binding recess;
   a magnetic body provided on the fastening member; and
   a Hall sensor provided on the main unit and configured to recognize the magnetic body,
   wherein an inner wall of the opening portion engages with the binding recess or the fastening member to mount an fix the main unit onto the wearing member, and
   wherein a direction in which the main unit is mounted with regard to the wearing member is detected as the Hall sensor recognizes the magnetic body while the main unit is mounted on the wearing member.

2. The body-wearable electronic device of claim 1, wherein the opening portion is arranged such that each of four inner walls constitutes at least a part of one side of a rectangle.

3. The body-wearable electronic device of claim 2, wherein, among the four inner walls of the opening portion, two adjacent inner walls are connected by a curved surface.

4. The body-wearable electronic device of claim 1, wherein the binding recess is formed in a closed curved line shape along the side surface of the main unit.

5. The body-wearable electronic device of claim 1, wherein the fastening member has the shape of a closed curved line surrounding the periphery of the main unit, or at least one pair of the fastening members are continuously arranged along the inner wall of the opening portion.

6. The body-wearable electronic device of claim 1, wherein the fastening member is electrically connected to the main unit.

7. The body-wearable electronic device of claim 1, wherein the body-wearable electronic device comprises:
   at least one electrode installed in the binding recess; and
   at least one contact terminal provided on the fastening member, and
   the electrode selectively contacts the contact terminal according to a direction in which the wearing member is coupled to the main unit.

8. The body-wearable electronic device of claim 1, wherein at least a part of the fastening member is exposed to a periphery of a front surface of the main unit between the main unit and the wearing member.

9. The body-wearable electronic device of claim 1, wherein the fastening member comprises a light-emitting element.

10. The body-wearable electronic device of claim 1, wherein the wearing member comprises:
    at least one seating portion forming an opening portion;
    a first wearing member extending from a part of a periphery of the seating portion towards one side; and
    a second wearing member extending from a different part of the periphery of the seating portion towards the other side, and
    the wearing member is maintained in a closed curved line shape, as the first and second wearing members are coupled to each other, and bound to the user's body.

11. The body-wearable electronic device of claim 10, wherein the seating portion has the shape of a closed curved line surrounding the opening portion.

12. The body-wearable electronic device of claim 10, wherein the wearing member further comprises:
    at least one binding protrusion provided on the first wearing member; and
    multiple binding holes provided on the second wearing member, and
    the binding protrusion engages with one of the binding holes and maintains the wearing member in a closed curved line shape.

13. The body-wearable electronic device of claim 1, wherein the main unit comprises a curved display device or a flexible display device mounted on a front surface.

14. The body-wearable electronic device of claim 1, wherein a plurality of the main units are mounted on the wearing member, respectively, and the main units interwork with each other.

15. An apparatus comprising:
- a wearing member configured to be worn on a user's body, the wearing member configured to be detachably connected to at least one main unit;
- an opening portion formed on the wearing member, wherein the opening portion faces at least a part of the main unit;
- a binding recess formed on a periphery of a side surface of the main unit; and
- at least one fastening member provided inside the opening portion and engaged with at least a part of the binding recess,
- wherein an inner wall of the opening portion engages with the binding recess or the fastening member to mount and fix the main unit onto the wearing member, and
- wherein the fastening member comprises a light-emitting element.

16. The apparatus of claim 15, wherein the wearing member comprises an opening portion disposed to face at least a part of the main unit.

* * * * *